(12) United States Patent
Hedler et al.

(10) Patent No.: US 7,517,727 B2
(45) Date of Patent: Apr. 14, 2009

(54) METHOD FOR CONNECTION OF AN INTEGRATED CIRCUIT TO A SUBSTRATE, AND A CORRESPONDING CIRCUIT ARRANGEMENT

(75) Inventors: Harry Hedler, Germering (DE); Anton Legen, Munich (DE)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 11/185,472

(22) Filed: Jul. 20, 2005

(65) Prior Publication Data
US 2006/0163717 A1 Jul. 27, 2006

(30) Foreign Application Priority Data
Aug. 3, 2004 (DE) .................... 10 2004 037 610

(51) Int. Cl.
*H01L 21/00* (2006.01)
(52) U.S. Cl. ............... 438/118; 438/106; 257/E21.001
(58) Field of Classification Search ............... 438/118; 257/E21.001
See application file for complete search history.

(56) References Cited

U.S. PATENT DOCUMENTS

| | | | | |
|---|---|---|---|---|
| 3,325,582 A * | 6/1967 | Sohner et al. | ............... | 174/16.3 |
| 4,990,208 A * | 2/1991 | Kano | ............... | 156/275.3 |
| 5,749,510 A * | 5/1998 | Eifuku | ............... | 228/122.1 |
| 5,852,326 A * | 12/1998 | Khandros et al. | ............... | 257/692 |
| 6,063,649 A * | 5/2000 | Yoshino | ............... | 438/118 |
| 6,081,071 A * | 6/2000 | Rogers | ............... | 313/512 |
| 6,191,952 B1 * | 2/2001 | Jimarez et al. | ............... | 361/771 |
| 6,294,407 B1 | 9/2001 | Jacobs | | |
| 6,396,145 B1 | 5/2002 | Nagai et al. | | |
| 6,482,673 B2 * | 11/2002 | Hashimoto | ............... | 438/106 |
| 6,495,053 B1 * | 12/2002 | Kneisel et al. | ............... | 216/13 |
| 6,544,371 B2 * | 4/2003 | Senoo et al. | ............... | 156/230 |
| 6,586,277 B2 * | 7/2003 | Jiang | ............... | 438/118 |
| 6,664,125 B2 * | 12/2003 | Watanabe et al. | ............... | 438/26 |
| 6,759,270 B2 * | 7/2004 | Infantolino et al. | ............... | 438/106 |
| 6,969,914 B2 * | 11/2005 | Fuller et al. | ............... | 257/780 |
| 6,992,380 B2 * | 1/2006 | Masumoto | ............... | 257/709 |
| 7,109,588 B2 * | 9/2006 | Jiang | ............... | 257/783 |
| 2002/0164838 A1 | 11/2002 | Moon et al. | | |
| 2002/0182774 A1 * | 12/2002 | Heckman | ............... | 438/118 |
| 2003/0038355 A1 * | 2/2003 | Derderian | ............... | 257/686 |
| 2005/0172891 A1 * | 8/2005 | Suzuki et al. | ............... | 118/300 |

FOREIGN PATENT DOCUMENTS

| | | |
|---|---|---|
| DE | 10030697 | 1/2002 |
| DE | 10221646 | 12/2003 |
| GB | 1412363 | 11/1975 |
| NL | 2817286 | 11/1978 |

* cited by examiner

*Primary Examiner*—Alexander G Ghyka
*Assistant Examiner*—Angel Roman
(74) *Attorney, Agent, or Firm*—Patterson & Sheridan, L.L.P.

(57) ABSTRACT

The present invention provides a method for connection of an integrated circuit (1), in particular of a chip, a wafer or a hybrid, to a substrate (10), which has the following steps: provision of an elastic intermediate layer (5) on the integrated circuit (1) and/or the substrate (10); structuring of the elastic layer (5) in raised areas (5*a*) and recessed areas (5*b*); and connection of the substrate (10) and of the integrated circuit (1) via the structured elastic intermediate layer (5). The invention likewise provides a corresponding circuit arrangement.

7 Claims, 5 Drawing Sheets

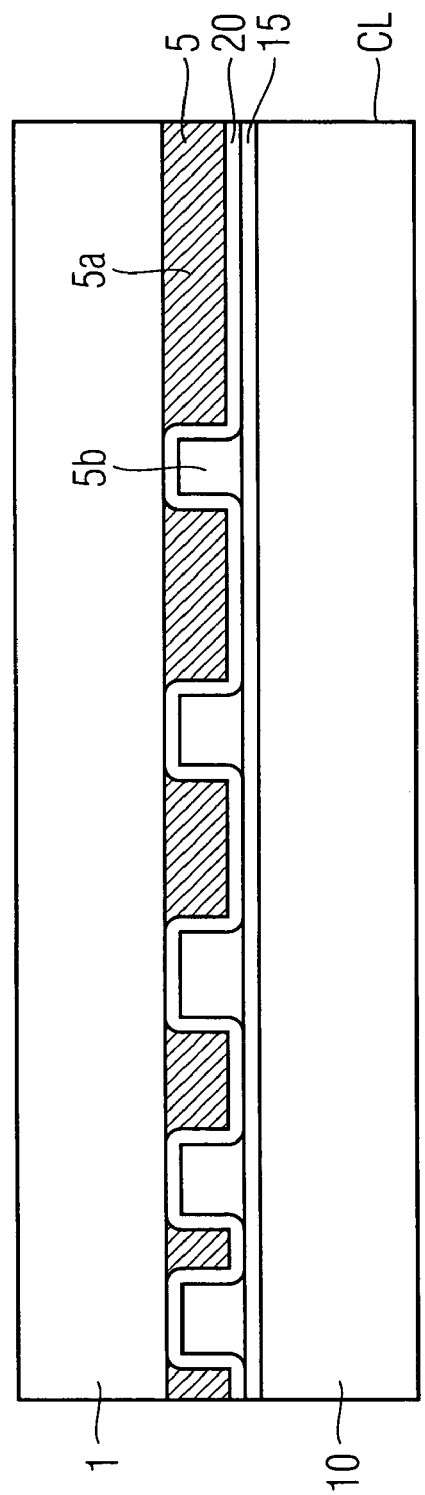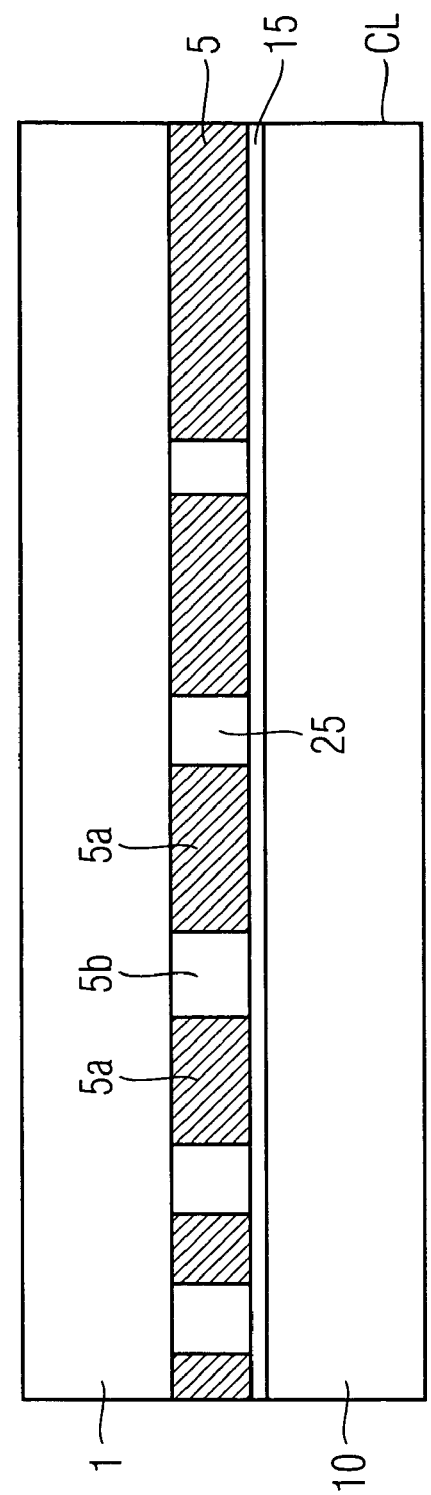
FIG 4
FIG 5

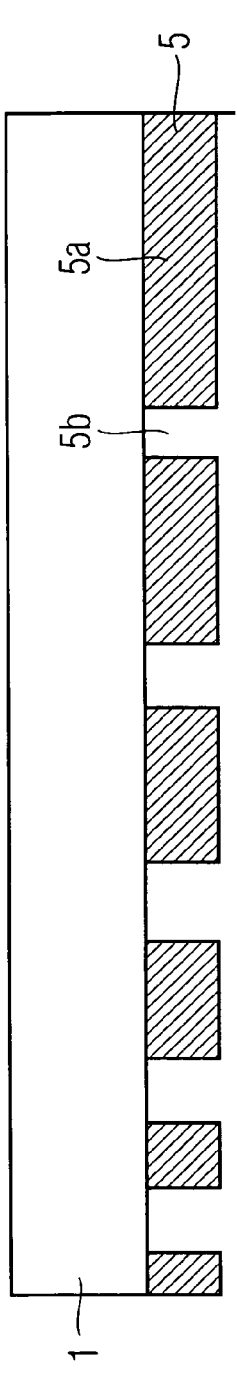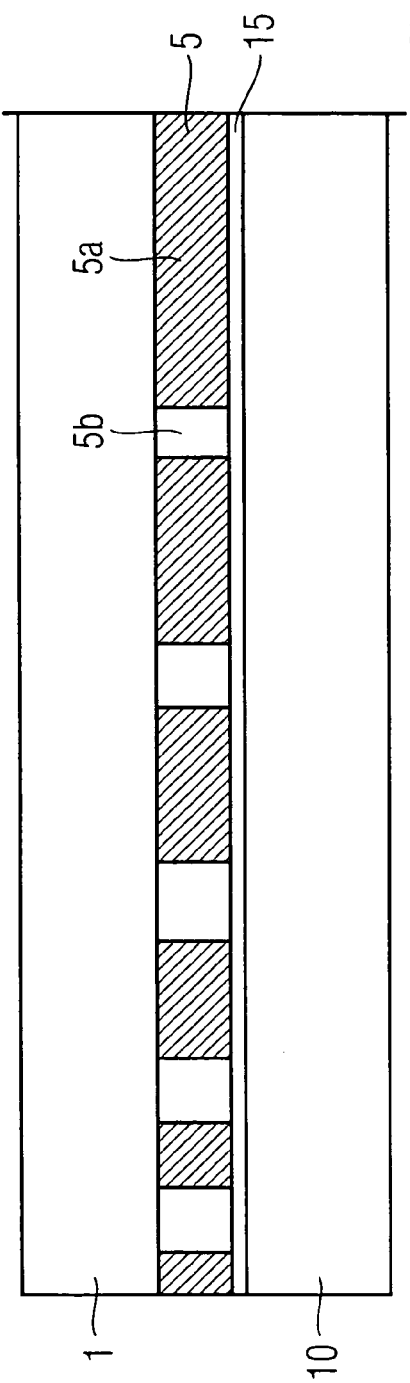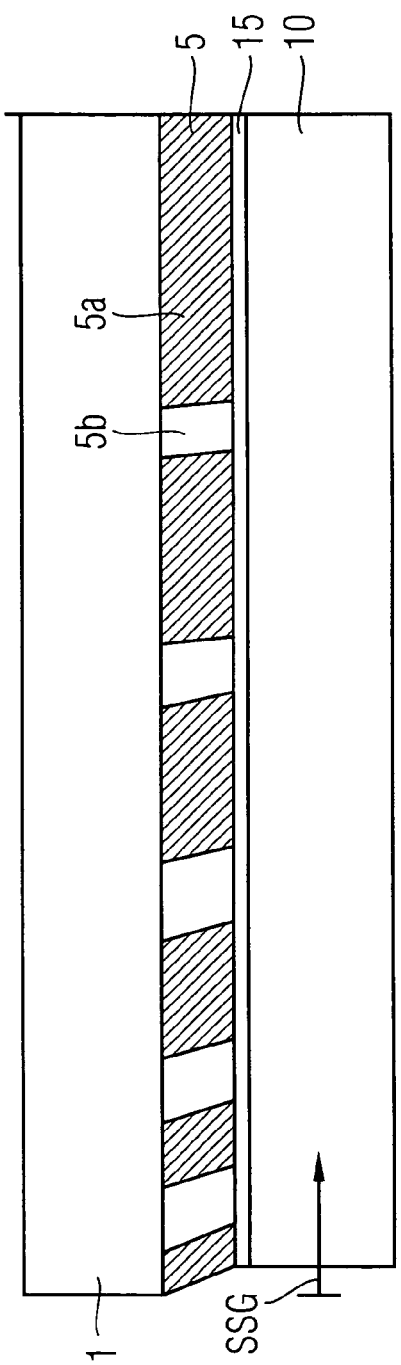

METHOD FOR CONNECTION OF AN INTEGRATED CIRCUIT TO A SUBSTRATE, AND A CORRESPONDING CIRCUIT ARRANGEMENT

BACKGROUND OF THE INVENTION

The present invention relates to a method for connection of an integrated circuit to a substrate, and to a corresponding circuit arrangement.

BACKGROUND ART

Although in principle it can be applied to any desired integrated circuits, the present invention as well as the problem on which it is based will be explained with reference to chips with integrated circuits using silicon technology.

Known CSP (Chip Size Package) or WLP (Wafer Level Package) solutions for the connection of an integrated circuit to a substrate have reliability problems in the event of temperature changes, particularly in the case of large circuit arrangements, to be precise in particular as the distances between the substrate and the packaged chip become ever smaller. The different thermal co-efficients of expansion of the packaged circuit arrangement and substrate result in different length expansions of both components during the temperature change.

In the case of chip size packages and wafer level packages, two types of connecting structures between the chip and the substrate have essentially been known until now.

The first, normal solution for connection of an integrated circuit to a substrate is the use of ball grid arrays with rigid small solder spheres or bumps for mechanical connection, with the additional use of a sub-filling, in order to increase the robustness. In this solution, the mismatch between the thermal characteristics of the chip and of the substrate, in particular of the thermal co-efficient of expansion, leads to major reliability risks. The small solder spheres can be sheared off when temperature changes occur. Particularly in the case of large chips, this considerably restricts the reliability.

In order to prevent undesirable defects such as these, various types of intermediate connecting layers (interposers) have been developed, which are used as a stress buffer between the chip with a low thermal co-efficient of expansion and the substrate with a high thermal co-efficient of expansion. Solutions such as these increase the height of the design, the number of connections and at least the costs.

All interposer substrate-based packages for chips require chip/substrate mounting and appropriate connection of the two partners. Nowadays, this no longer satisfies the requirements for thermomechanical freedom from stresses over the entire application range. This results in stress-induced bending of the connection or of the package, representing reliability risks.

FIGS. 7a, b show schematic views of one known circuit arrangement of the interposer type in the form of a longitudinal section in order to explain the problem on which the invention is based.

In FIG. 7a, the reference symbol 1 denotes a chip which is connected via an adhesive layer 2 to a substrate 10, for example a printed circuitboard. The adhesive layer 2 is provided over the entire surface between the type 1 and the substrate. In FIG. 7a, the temperature is assumed to be room temperature.

As shown in FIG. 7b, when the temperature rises to, for example, 120° C., this stack comprising the chip 1, adhesive layer 2 and substrate 10 bends VBG with respect to the centre line CL of the chip (the other identical chip half is not illustrated).

One major disadvantage of a stack such as this is that it has poor thermomechanical characteristics. An improvement can admittedly be achieved by increasing the adhesive thickness, but this increase in the adhesive thickness results in the disadvantage of poor thermal matching between the chip and the substrate, in particular poor heat dissipation.

A relatively stress-free connection between the chip and the substrate with very good thermal coupling is also not possible with a stack such as this.

BRIEF SUMMARY OF THE INVENTION

One object of the present invention is to provide a simple and low-cost method for connection of an integrated circuit to a substrate, and to provide a corresponding circuit arrangement, which remains largely uninfluenced by thermal mismatching.

According to the invention, this object is achieved by the method for connection of an integrated circuit to a substrate, and by the corresponding circuit arrangement wherein an elastic intermediate layer which is structured in raised areas and recessed areas is provided on the integrated circuit and/or the substrate, and the substrate and the integrated circuit are connected to one another via the structured elastic intermediate layer.

The idea on which the present invention is based is to provide a structured and elastic interposer (intermediate layer) on the chip and/or the substrate, and a subsequent direct or indirect connection of the chip and substrate via the structured and elastic interposer. In this case, the structuring is implemented in such a way that the shape supports the different thermal expansions of the chip and of the substrate.

Advantageous developments and improvements of the respective subject matter of the invention can be found in the dependent claims.

According to one preferred development, the connection is made directly.

According to a further preferred development, the connection is made indirectly by the provision of an intermediate adhesive layer.

According to a further preferred development, the raised and recessed areas are structured in the form of strips or in an annular shape.

According to a further preferred development, the raised and/or recessed areas are structured such that they have a variable width.

According to a further preferred development, the structuring is carried out photolithographically.

According to a further preferred development, the elastic intermediate layer is provided and structured only on the integrated circuit or only on the substrate, after which a thermally conductive layer is provided above the structured elastic intermediate layer, but does not fill the recessed areas.

According to a further preferred development, the elastic intermediate layer is provided and structured only on the integrated circuit or only on the substrate, after which the recessed areas are filled with a thermally conductive layer.

BRIEF DESCRIPTION OF THE SEVERAL VIEWS OF THE DRAWINGS

Exemplary embodiments of the invention will be explained in more detail in the following description, and are illustrated in the drawings, in which:

FIG. 4 shows a schematic view of a circuit arrangement according to a third embodiment of the present invention, in the form of a longitudinal section;

FIG. 5 shows a schematic view of a circuit arrangement according to a fourth embodiment of the present invention, in the form of a longitudinal section;

FIGS. 6a-c show schematic views of a circuit arrangement according to a fifth embodiment of the present invention, in the form of a longitudinal section, in various stages.

Identical reference symbols in the figures denote identical or functionally identical components.

DETAILED DESCRIPTION OF THE INVENTION

Figure 1:
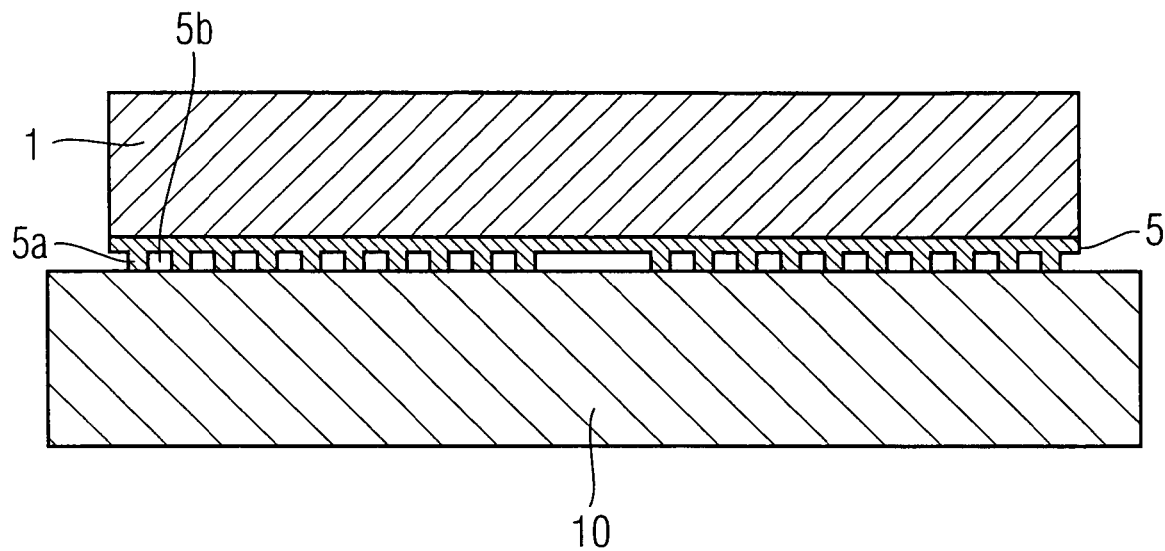
FIG. 1 shows a schematic view of a circuit arrangement according to a first embodiment of the present invention, in the form of a longitudinal section.

FIG. 1 shows a schematic view of a circuit arrangement according to a first embodiment of the present invention, in the form of a longitudinal section.

In FIG. 1, the reference symbol 1 denotes an integrated circuit in the form of a semiconductor chip. The reference symbol 10 denotes a substrate, for example a printed circuit-board. An elastic intermediate layer 5 is provided on the side of the integrated circuit 1 facing the substrate 10 and is structured into raised areas 5a and recessed areas 5b. The raised areas 5a are connected to the upper face of the substrate 10. This connection may either be a direct connection, if the elastic intermediate layer 5 has adhesive characteristics, for example after heating, or may be provided indirectly, by means of an adhesive layer.

Figure 2:
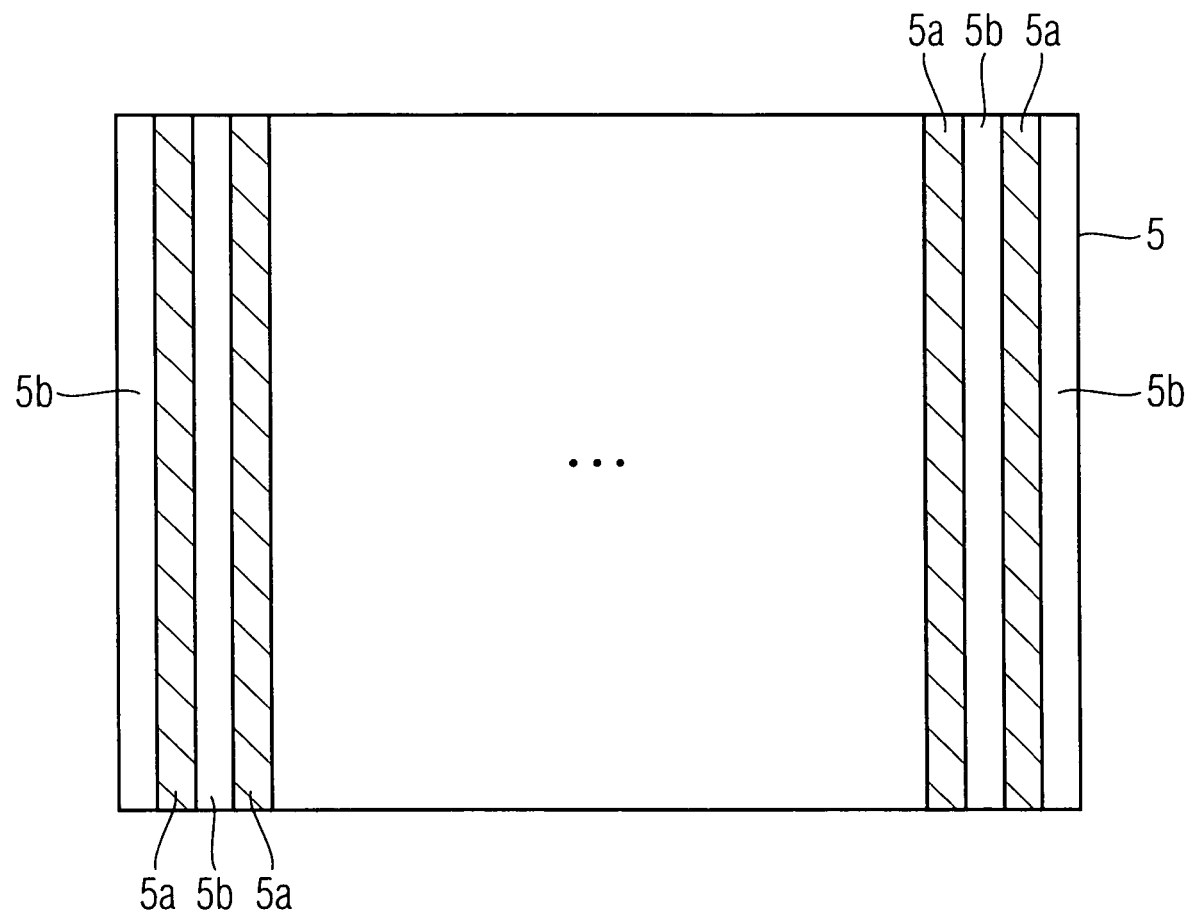
FIG. 2 shows a schematic view of a part of the circuit arrangement according to the first embodiment of the present invention, in the form of a cross section.

FIG. 2 shows a schematic view of a part of the circuit arrangement according to the first embodiment of the present invention, in the form of a cross section.

In FIG. 2, the structure of the elastic intermediate layer 5 has linear raised areas 5a and recessed areas 5b.

Structures such as this can be achieved, for example, by a printing method or a lithographic etching method.

Figure 3:
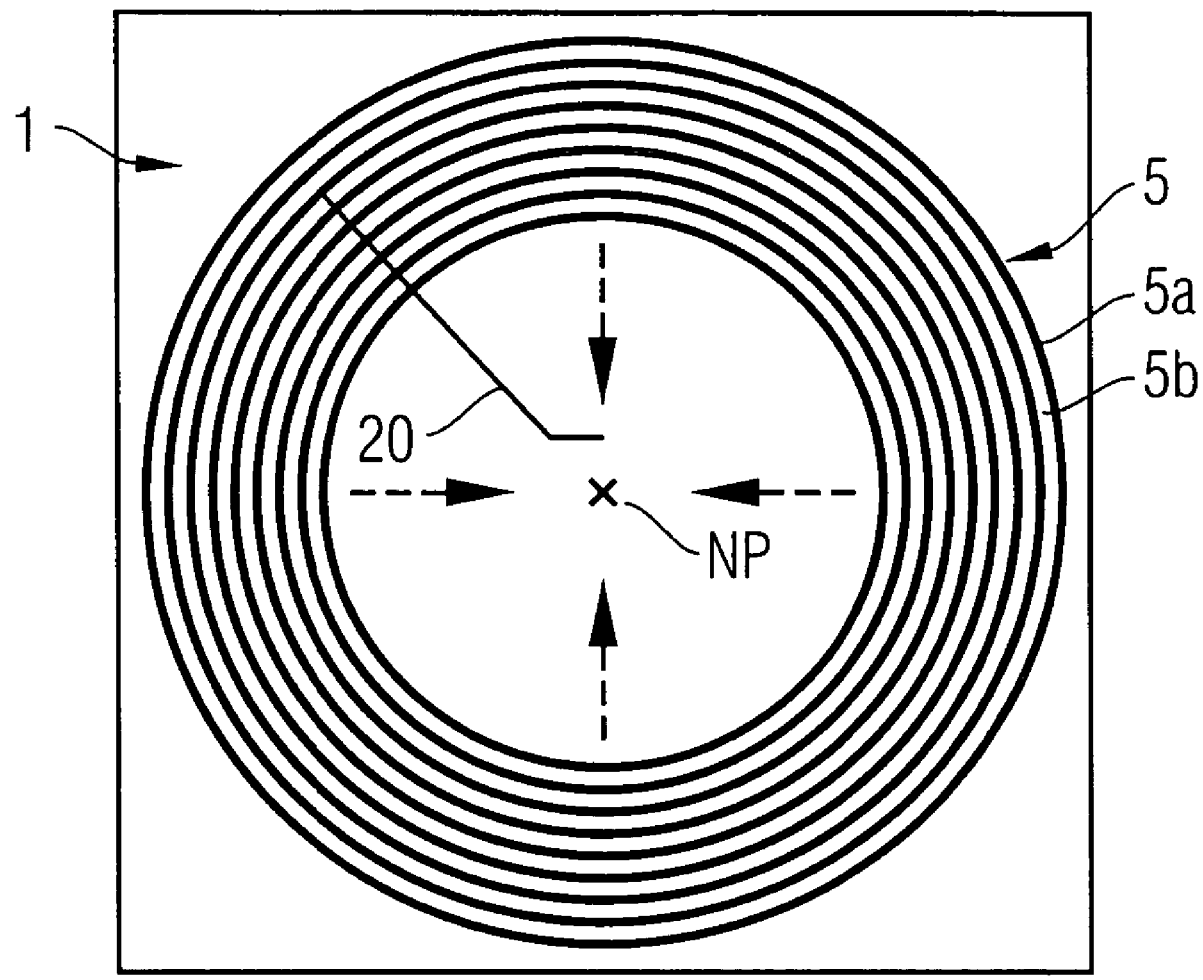
FIG. 3 shows a schematic view of a part of the circuit arrangement according to a second embodiment of the present invention, in the form of a cross section.
Figures 7A, 7B:
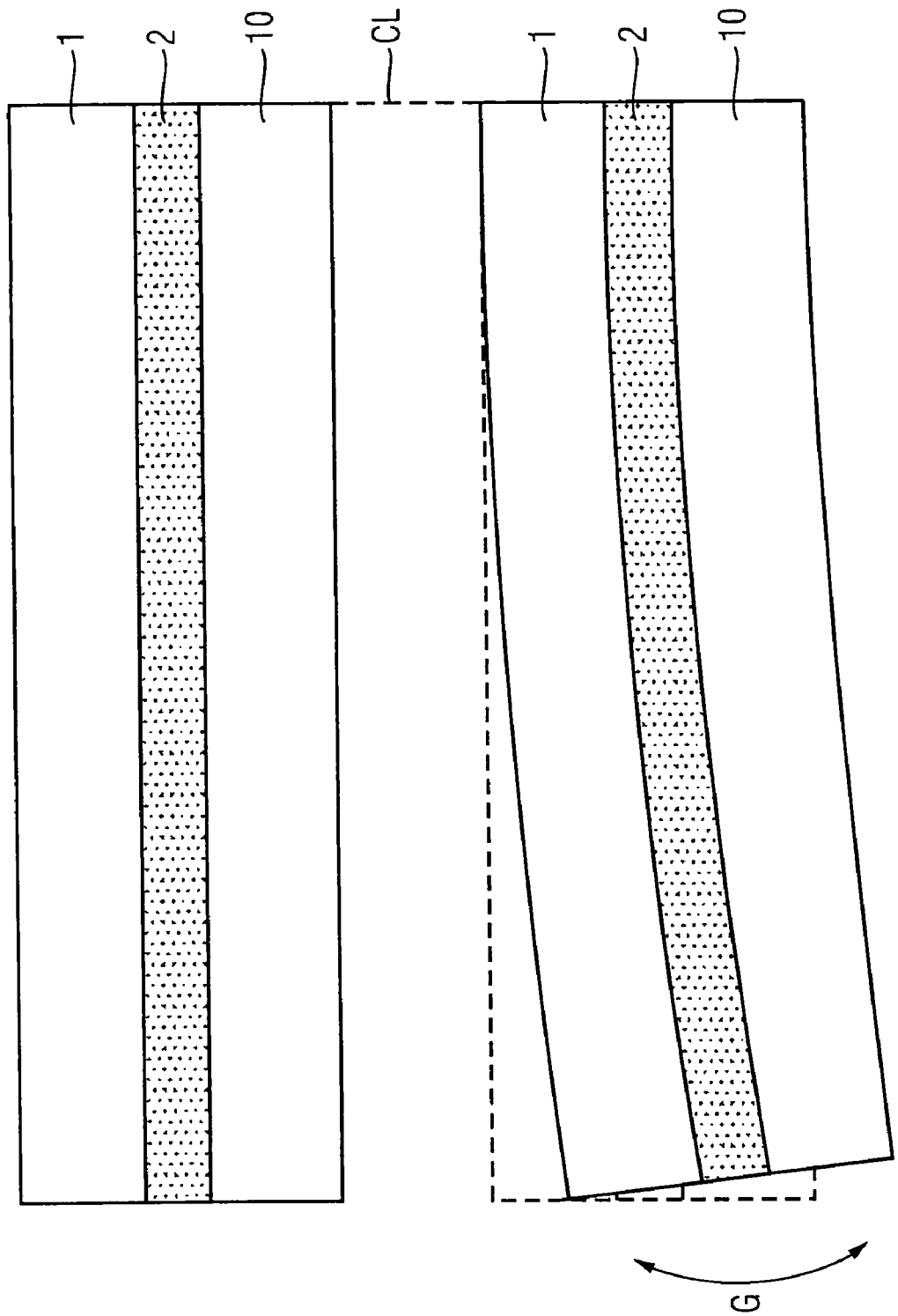
FIGS. 7a, b show schematic views of a known circuit arrangement, in the form of a longitudinal section.

FIG. 3 shows a schematic view of a part of the circuit arrangement according to a second embodiment of the present invention, in the form of a cross section.

FIG. 3 shows the preferred structuring of the elastic intermediate layer 5. This comprises circular reliefs around a centre NP, which preferably corresponds to the neutral point of the thermal expansion.

Such circular reliefs are most suitable when the load is radial and uniform. The reference symbol 20 in FIG. 3 additionally denotes metallization which preferably runs at right angles to the relief lines.

FIG. 4 shows a schematic view of a circuit arrangement according to a third embodiment of the present invention, in the form of a longitudinal section.

In the embodiment shown in FIG. 4, in addition to the first embodiment, a thermally conductive layer 20, for example a metal layer, is provided by sputtering or plating on the surface with the structured elastic intermediate layer 5. The connection between the thermally conductive layer 20 and the substrate 10 is provided by an adhesive layer 15. The thermally conductive layer 20 makes it possible to use the surface of the elastic intermediate layer 5 in order to improve the thermal coupling between the chip 1 and the substrate 10.

Copper is particularly highly suitable for the thermally conductive layer 20 and may be applied both by sputtering and electrochemically.

In addition, in this embodiment, the width of the raised areas 5a decreases from the centre line CL of the chip (the other identical chip half is not illustrated) towards the edge.

FIG. 5 shows a schematic view of a circuit arrangement according to a fourth embodiment of the present invention, in the form of a longitudinal section.

In the embodiment shown in FIG. 5, a thermally conductive layer 25 is provided in the intermediate spaces between the raised areas 5a, that is to say in the recessed areas 5b, and provides the stated thermal coupling function between the chip 1 and the substrate 10.

One material which is suitable for filling the recessed areas 5b with the thermally conductive layer 25 is a thermally conductive paste. On the one hand, this results in excellent thermal coupling, while this material on the other hand does not produce any additional stiffening in the plane, owing to its viscosity.

FIGS. 6a-c show schematic views of a circuit arrangement according to a fifth embodiment of the present invention, in the form of a longitudinal section in various stages.

In FIG. 6a, an elastic layer is first of all provided on photoselective silicone on the surface of the chip 1.

Silicone has the advantage of having an extremely low modulus of elasticity of <50 MPa. Preferred dimensions for the elastic intermediate layer 5 are a thickness of between 30 and 100 μm, and intermediate spaces of between 30 and 100 μm.

The structure is produced on the raised areas 5a and the recessed areas 5b photolithographically. In this embodiment as well, the diameter of the raised areas 5a decreases from the centre line CL of the chip (the other identical chip half is not illustrated) towards the edge.

Furthermore, FIG. 6b shows that the thin adhesive layer 15 is applied to the substrate 10 before the application of the elastic layer 5, in order to produce a firm connection.

FIG. 6c shows the heating of the structure shown in FIG. 6b, which is illustrated at room temperature, to a temperature of 120° C.

In the case of large chips, a length expansion difference of up to 20 μm may occur, which can be compensated for geometrically very well by the corresponding length to gap ratios of the elastic intermediate layer 5, as is illustrated in FIG. 6c.

In this context, it is also important for the bonding process by means of the adhesive layer 15 to be carried out at as low a bonding temperature as possible, in order to minimize additional frozen-in stresses. This is because the elastic intermediate layer 5 need then compensate only for the shear stresses SSG resulting from the thermal mismatch between the chip 1 and the substrate 10.

Although the present invention has been described above with reference to a preferred exemplary embodiment, it is not restricted to this but can be modified in many ways.

In particular, the present invention can be used not only for chips but also for hybrids and wafers or other integrated circuits. The invention is also not restricted to the stated materials.

The elastic intermediate layer may be removed in the recessed areas as far as the layer thickness, or only as far as a part of the layer thickness.

An elastic intermediate layer which is structured on one face of the connection may also be connected to an elastic intermediate layer which is not structured on the other side of the connection.

LIST OF REFERENCE SYMBOLS

1 Integrated circuit
2 Adhesive layer
10 Substrate
5 Elastic intermediate layer
5a, 5b Raised, recessed areas
20 Metallization
CL Centre line
20, 25 Thermally conductive layer
15 Adhesive layer
SSG Shear stress
VBG Bend

What is claimed is:

1. A method for connection of an integrated circuit, in particular of a chip, a wafer or a hybrid, to a substrate, which has the following steps:
   (a) providing an elastic intermediate layer on the integrated circuit and/or the substrate;
   (b) structuring the elastic layer in raised areas and recessed areas wherein the structuring of the elastic layer comprises at least two concentric circular reliefs around the same center of the integrated circuit; and
   (c) connecting the substrate and the integrated circuit via the structured elastic intermediate layer,
   wherein a metallization structure in a form of at least one strip contacts the circular reliefs and is oriented at right angles to the circular reliefs.

2. The method according to claim 1, wherein the connection is made directly.

3. The method according to claim 1, wherein the connection is made indirectly by provision of an intermediate adhesive layer.

4. The method according to claim 1, wherein the raised and/or recessed areas are structured such that they have a variable width.

5. The method according to claim 1, wherein the structuring is carried out photolithographically.

6. The method according to claim 1, wherein the elastic intermediate layer is provided and structured only on the integrated circuit or only on the substrate, and a thermally conductive layer is provided above the structured elastic intermediate layer, but does not fill the recessed areas.

7. The method according to claim 1, wherein the elastic intermediate layer is provided and structured only on the integrated circuit or only on the substrate, and the recessed areas are filled with a thermally conductive layer.

* * * * *